(12) United States Patent
Sunda et al.

(10) Patent No.: US 11,715,814 B2
(45) Date of Patent: *Aug. 1, 2023

(54) LIGHT EMITTING ELEMENT INCLUDING FIRST AND SECOND SEMICONDUCTOR LAYERED BODIES HAVING DEFINED RELATIVE LATERAL SURFACE ANGLES

(71) Applicant: NICHIA CORPORATION, Anan (JP)

(72) Inventors: Takamasa Sunda, Tokushima (JP); Hitoshi Nagai, Tokushima (JP)

(73) Assignee: NICHIA CORPORATION, Anan (JP)

( * ) Notice: Subject to any disclaimer, the term of this patent is extended or adjusted under 35 U.S.C. 154(b) by 200 days.

This patent is subject to a terminal disclaimer.

(21) Appl. No.: 17/129,322

(22) Filed: Dec. 21, 2020

(65) Prior Publication Data

US 2021/0111307 A1 Apr. 15, 2021

Related U.S. Application Data

(63) Continuation of application No. 16/279,981, filed on Feb. 19, 2019, now Pat. No. 10,903,394.

(30) Foreign Application Priority Data

Feb. 19, 2018 (JP) ................. 2018-027240

(51) Int. Cl.
*H01L 33/10* (2010.01)
*H01L 33/24* (2010.01)
(Continued)

(52) U.S. Cl.
CPC ............ *H01L 33/10* (2013.01); *H01L 27/153* (2013.01); *H01L 33/24* (2013.01); *H01L 33/32* (2013.01);
(Continued)

(58) Field of Classification Search
CPC ......... H01L 33/10; H01L 33/24; H01L 33/32; H01L 33/38; H01L 33/46; H01L 33/60; H01L 27/153
See application file for complete search history.

(56) References Cited

U.S. PATENT DOCUMENTS 5,869,848 A 2/1999 Nobori et al.
7,781,790 B2 8/2010 Minato et al.
(Continued)

FOREIGN PATENT DOCUMENTS

JP 2003-347589 A 12/2003
JP 2004-079972 A 3/2004
(Continued)

OTHER PUBLICATIONS

Non-Final Office Action on U.S. Appl. No. 16/279,981 dated Jun. 25, 2020.
(Continued)

*Primary Examiner* — Lex H Malsawma
(74) *Attorney, Agent, or Firm* — Foley & Lardner LLP

(57) ABSTRACT

A light emitting element includes: a substrate including a first surface including a first region and a second region; a first semiconductor layered body on the first region, the first semiconductor layered body comprising a first light emitting layer and including: a first lateral surface, and a second lateral surface opposite to the first lateral surface; and a second semiconductor layered body on the second region, the second semiconductor layered body comprising a second light emitting layer and including: a first lateral surface facing the second lateral surface and located on a first semiconductor layered body side of the second semiconductor layered body, and a second lateral surface opposite to the
(Continued)

first lateral surface and located on a side opposite the first semiconductor layered body side of the second semiconductor layered body.

18 Claims, 8 Drawing Sheets

(51) Int. Cl.
    *H01L 33/32*     (2010.01)
    *H01L 27/15*     (2006.01)
    *H01L 33/46*     (2010.01)
    *H01L 33/60*     (2010.01)
    *H01L 33/38*     (2010.01)

(52) U.S. Cl.
    CPC .............. *H01L 33/38* (2013.01); *H01L 33/46* (2013.01); *H01L 33/60* (2013.01)

(56) References Cited

U.S. PATENT DOCUMENTS

| | | | |
|---|---|---|---|
| 8,502,242 B2 | 8/2013 | Kim | |
| 10,903,394 B2* | 1/2021 | Sunda | .................. H01L 27/153 |
| 2005/0230700 A1 | 10/2005 | Stefanov et al. | |
| 2006/0163589 A1 | 7/2006 | Fan et al. | |
| 2007/0284600 A1 | 12/2007 | Shchekin et al. | |
| 2010/0012956 A1 | 1/2010 | Yoo | |
| 2010/0047943 A1 | 2/2010 | Lee et al. | |
| 2011/0204387 A1 | 8/2011 | Kim et al. | |
| 2011/0260188 A1 | 10/2011 | Choi et al. | |
| 2012/0049219 A1 | 3/2012 | Kamiya et al. | |
| 2013/0256712 A1 | 10/2013 | Hwang et al. | |
| 2014/0159071 A1 | 6/2014 | Choi et al. | |
| 2016/0056351 A1 | 2/2016 | Yang et al. | |
| 2016/0126422 A1 | 5/2016 | Jeon et al. | |
| 2016/0343910 A1 | 11/2016 | Huang et al. | |

FOREIGN PATENT DOCUMENTS

| | | |
|---|---|---|
| JP | 2008-004948 A | 1/2008 |
| JP | 2011-171739 A | 9/2011 |
| JP | 2013-207305 A | 10/2013 |
| JP | 2014-116604 A | 6/2014 |
| JP | 5633477 B2 | 12/2014 |
| JP | 2016-012707 A | 1/2016 |

OTHER PUBLICATIONS

Notice of Allowance on U.S. Appl. No. 16/279,981 dated Oct. 5, 2020.

* cited by examiner

LIGHT EMITTING ELEMENT INCLUDING FIRST AND SECOND SEMICONDUCTOR LAYERED BODIES HAVING DEFINED RELATIVE LATERAL SURFACE ANGLES

CROSS-REFERENCE TO RELATED APPLICATIONS

The present application is a continuation of U.S. patent application Ser. No. 16/279,981, filed on Feb. 19, 2019, which claims priority to Japanese Patent Application No. 2018-027240, filed on Feb. 19, 2018, the disclosures of which are hereby incorporated by reference in their entireties.

BACKGROUND

1. Technical Field

The present disclosure relates to alight emitting element.

2. Description of Related Art

Light emitting elements have various uses. Some uses require that a light emitting element have a light distribution characteristic exhibiting high intensity of light emitted laterally from the light emitting element (see, for example, JP 5633477 B).

SUMMARY

The present invention allows for providing a light emitting element that has a light distribution characteristic with high intensity of light emitted laterally from the light emitting element.

Alight emitting element according to one embodiment of the present disclosure includes: a substrate including a first surface including a first region and a second region; a first semiconductor layered body including a first light emitting layer and disposed on a first region of the first surface; and a second semiconductor layered body including a second light emitting layer and disposed on a second region of the first surface. The first semiconductor layered body includes a first lateral surface and a second lateral surface opposite to the first lateral surface of the first semiconductor layered body. The second semiconductor layered body includes a first lateral surface facing the second lateral surface of the first semiconductor layered body and located closer to the first semiconductor layered body, and a second lateral surface opposite to the first lateral surface of the second semiconductor layered body and located farther from the first semiconductor layered body.

A first angle defined by the first lateral surface of the first semiconductor layered body and the first region is smaller than a second angle defined by the second lateral surface of the first semiconductor layered body and the first region.

A fourth angle defined by the second lateral surface of the second semiconductor layered body and the second region is smaller than a third angle defined by the first lateral surface of the second semiconductor layered body and the second region.

Certain embodiments of the present invention allows for providing the light emitting element having a light distribution characteristic with high intensity of light emitted laterally from the light emitting element.

DETAILED DESCRIPTION OF EMBODIMENTS

Figure 1:
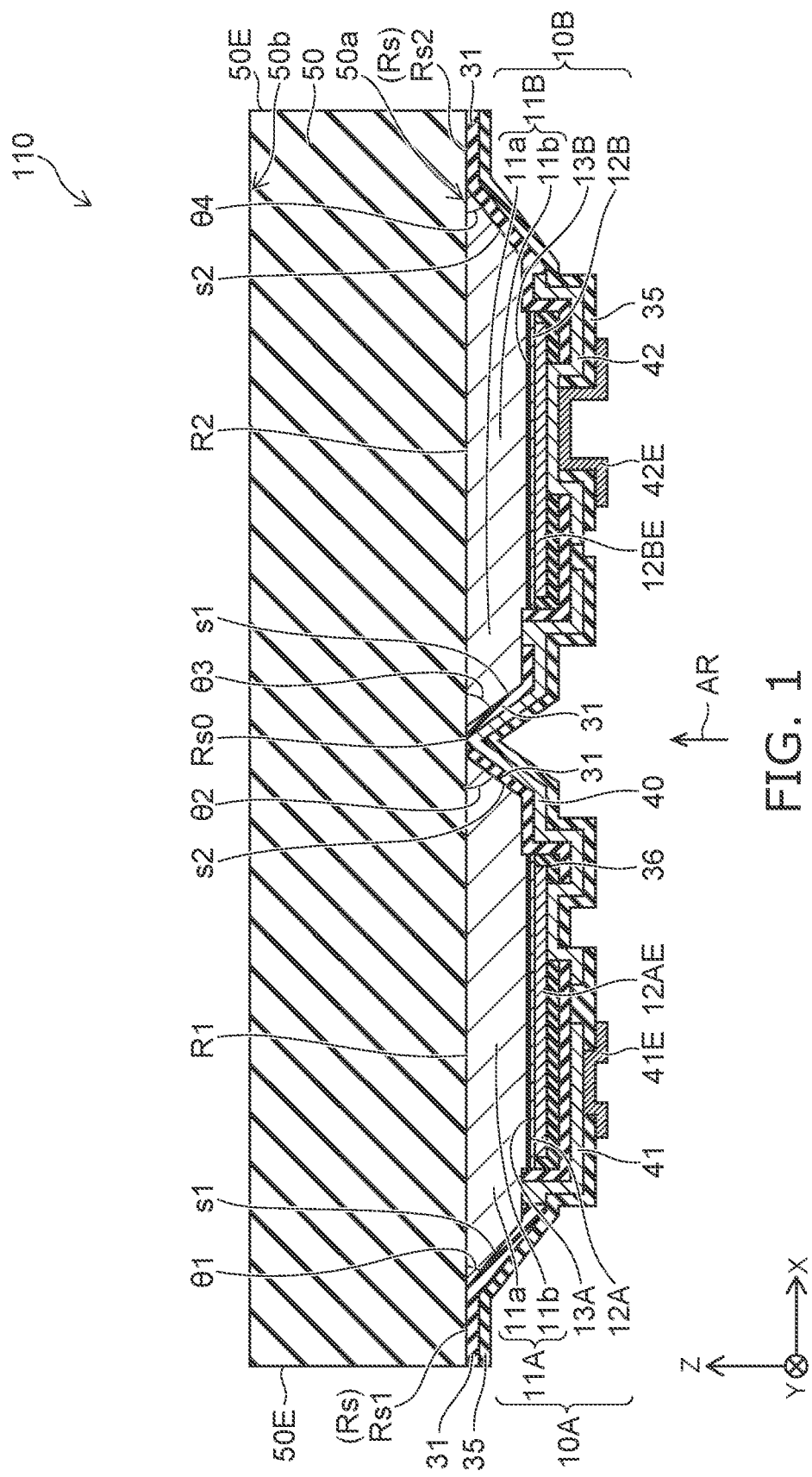
FIG. 1 is a schematic cross-sectional view exemplarily showing a light emitting element according to a first embodiment.

Certain embodiments of the present invention will be described below with reference to the drawings.

The drawings are schematic, and the relationship between the thickness and width of corresponding portions, the ratio between corresponding portions, and the like in the drawings are not necessarily to scale. Further, an identical portion may be illustrated with different dimensions or ratios among the drawings.

In the present specification, an element similar to those described earlier with reference to the drawings may be denoted by the identical reference numeral, and the detailed description thereof may be omitted as appropriate.

First Embodiment

FIG. 1 is a schematic cross-sectional view exemplarily showing a light emitting element according to a first embodiment.

Figure 2:
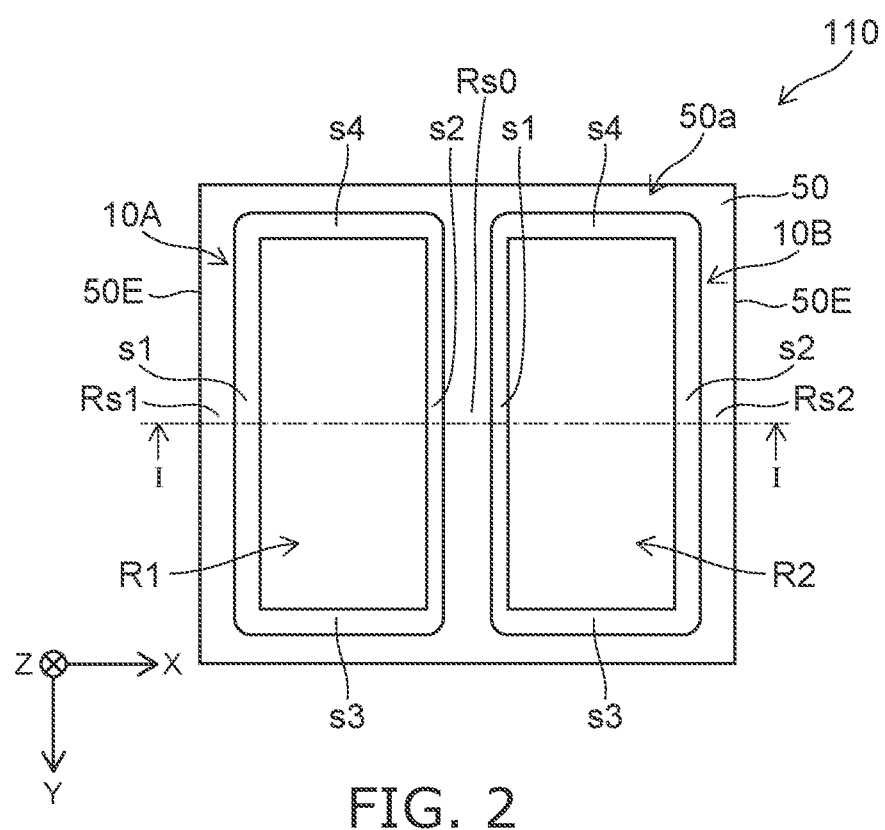
FIG. 2 is a schematic plan view exemplarily showing the light emitting element according to the first embodiment.

FIG. 2 is a schematic plan view exemplarily showing the light emitting element according to the first embodiment.

FIG. 1 is a cross-sectional view taken along line I-I in FIG. 2. FIG. 2 is a plan view when viewed in a direction indicated by arrow AR in FIG. 1. In FIG. 2, illustrations of some elements are omitted for the sake of clarity.

As shown in FIGS. 1 and 2, a light emitting element 110 according to the first embodiment includes a substrate 50, a first semiconductor layered body 10A, and a second semiconductor layered body 10B.

As shown in FIG. 1, the substrate 50 includes a first surface 50a and a second surface 50b. The second surface 50b is a surface opposite to the first surface 50a. The first semiconductor layered body 10A and the second semiconductor layered body 10B are disposed on the first surface 50a. In this example, each of the first surface 50a and the second surface 50b of the substrate 50 has a substantially square shape. When the substrate 50 has a substantially square shape, the length of each side may be in a range of 300 μm to 3000 μm, preferably 500 μm to 1500 μm.

A direction perpendicular to the first surface 50a is referred to as a "Z-axis direction." One direction perpendicular to the Z-axis direction is referred to as an "X-axis direction." The direction perpendicular to the Z-axis direction and the X-axis direction is referred to as a "Y-axis direction."

For example, a direction from the first semiconductor layered body 10A to the second semiconductor layered body 10B is referred to as the X-axis direction.

As shown in FIG. 1, the first surface 50a includes a first region R1 and a second region R2. In this example, the direction from the first region R1 to the second region R2 coincides with the X-axis direction.

The first semiconductor layered body 10A is disposed on the first region R1. The second semiconductor layered body 10B is disposed on the second region R2. In the first surface 50a, the region where the first semiconductor layered body 10A is provided is the first region R1. In the first surface 50a, the region where the second semiconductor layered body 10B is provided is the second region R2.

The first semiconductor layered body 10A includes, for example, a first light emitting layer 13A, an n-type semiconductor layer 11A, and a p-type semiconductor layer 12A. The n-type semiconductor layer 11A includes a first partial region 11a and a second partial region 11b. For example, in the first semiconductor layered body 10A, the first light emitting layer 13A is disposed between the p-type semiconductor layer 12A and the first region R1. The second partial region 11b is located between the first light emitting layer 13A and the first region R1. The first partial region 11a does not overlap the p-type semiconductor layer 12A and does not overlap the first light emitting layer 13A in the Z-axis direction.

The second semiconductor layered body 10B includes, for example, a second light emitting layer 13B, an n-type semiconductor layer 11B, and a p-type semiconductor layer 12B. The n-type semiconductor layer 11B also includes a first partial region 11a and a second partial region 11b. For example, in the second semiconductor layered body 10B, a second light emitting layer 13B is disposed between the p-type semiconductor layer 12B and the second region R2. The second partial region 11b is located between the second light emitting layer 13B and the second region R2. The first partial region 11a does not overlap the p-type semiconductor layer 12B and does not overlap the second light emitting layer 13B in the Z-axis direction.

These semiconductor layers include, for example, a nitride semiconductor. The light emitting layers include, for example, a nitride semiconductor. The nitride semiconductor includes, for example, $In_XAl_YGa_{1-X-Y}N$ ($0 \le X$, $0 \le Y$, $X+Y<1$).

In this example, a first conductive film 12AE is provided at the p-type semiconductor layer 12A, and a second conductive film 12BE is disposed on the p-type semiconductor layer 12B. Each of the first and second conductive films 12AE and 12BE contain, for example, a metal having a high reflectance. Thus, high reflectance can be obtained. For the first and second conductive films 12AE and 12BE, for example, Al or Ag can be used.

In this example, a first conductive member 41 is electrically connected to the first partial region 11a of the first semiconductor layered body 10A. The first conductive member 41 is electrically connected to a first electrode 41E.

A first end portion of the connecting member 40 is electrically connected to the first conductive film 12AE, which is electrically connected to the p-type semiconductor layer 12A. A second end portion of the connecting member 40 is electrically connected to the first partial region 11a of the n-type semiconductor layer 11B of the second semiconductor layered body 10B.

A second conductive member 42 is electrically connected to the second conductive film 12BE, which is electrically connected to the p-type semiconductor layer 12B of the second semiconductor layered body 10B. The second conductive member 42 is electrically connected to a second electrode 42E.

An insulating layer 35 and an insulating layer 36 are respectively provided between corresponding ones of the above-described conductive members. Further, the insulating layer 35 covers portions except for the electrodes. These insulating layers 35 and 36 include, for example, at least one of silicon oxide, silicon nitride, and silicon oxynitride. In this example, a first reflecting layer 31 is provided. The first reflecting layer 31 is disposed on the lateral surface of the semiconductor layered body and the like. The first reflecting layer 31 has, for example, insulating property. An example of the first reflecting layer 31 will be described below.

The first semiconductor layered body 10A and the second semiconductor layered body 10B are connected to each other in series. For example, voltage is applied across the first electrode 41E and the second electrode 42E. Current passes through each of the first and second semiconductor layered bodies 10A and 10B, so that a light emitting layer of each of the first and second semiconductor layered bodies 10A and 10B emit light. The semiconductor layered bodies are, for example, LEDs.

As shown in FIGS. 1 and 2, the first semiconductor layered body 10A includes first to fourth lateral surfaces s1 to s4. The first to fourth lateral surfaces s1 to s4 cross the X-Y plane. The second lateral surface s2 is opposite to the first lateral surface s1 of the first semiconductor layered body 10A. The fourth lateral surface s4 is opposite to the third lateral surface s3 of the first semiconductor layered body 10A.

Similarly, the second semiconductor layered body 10B includes first to fourth lateral surfaces s1 to s4. The first to fourth lateral surfaces s1 to s4 cross the X-Y plane. The second lateral surface s2 of the second semiconductor layered body 10B is opposite to the first lateral surface s1 of the second semiconductor layered body 10B. The fourth lateral surface s4 of the second semiconductor layered body 10B is opposite to the third lateral surface s3 of the second semiconductor layered body 10B.

As shown in FIG. 2, in each of the first semiconductor layered body 10A and the second semiconductor layered body 10B, for example, the first lateral surface s1 and the second lateral surface s2 extend along the Y-axis direction. For example, the first lateral surface s1 and the second lateral surface s2 cross the X-axis direction. For example, the direction from the first lateral surface s1 to the second lateral surface s2 coincides with the X-axis direction. For example, the third lateral surface s3 and the fourth lateral surface s4 extend along the X-axis direction. The third lateral surface s3 and the fourth lateral surface s4 cross the Y-axis direction. For example, the direction from the third lateral surface s3 to the fourth lateral surface s4 coincides with the Y-axis direction.

The first lateral surface s1 of the second semiconductor layered body 10B faces the second lateral surface s2 of the first semiconductor layered body 10A, and is located nearer to the first semiconductor layered body 10A. The second lateral surface s2 of the second semiconductor layered body 10B is opposite to the first lateral surface s1 of the second semiconductor layered body 10B, and is located farther from the first semiconductor layered body 10A.

For example, the distance between the first lateral surface s1 of the second semiconductor layered body 10B and the first semiconductor layered body 10A (more specifically, for example, the second lateral surface s2 of the first semiconductor layered body 10A) is shorter than the distance between the second lateral surface s2 of the second semiconductor layered body 10B and the first semiconductor layered body 10A (more specifically, for example, the second lateral surface s2 of the first semiconductor layered body 10A).

For example, the second lateral surface s2 of the first semiconductor layered body 10A is positioned between the first lateral surface s1 of the first semiconductor layered body 10A and the second lateral surface s2 of the second semiconductor layered body 10B. The first lateral surface s1 of the second semiconductor layered body 10B is positioned between the second lateral surface s2 of the first semiconductor layered body 10A and the second lateral surface s2 of the second semiconductor layered body 10B.

As shown in FIG. 1, the angle defined by the first lateral surface s1 of the first semiconductor layered body 10A and the first region R1 is referred to as a "first angle θ1." The angle defined by the second lateral surface s2 of the first semiconductor layered body 10A and the first region R1 is referred to as a "second angle θ2." In the first embodiment, the first angle θ1 is smaller than the second angle θ2.

The angle defined by the first lateral surface s of the second semiconductor layered body 10B and the second region R2 of the second semiconductor layered body 10B is referred to as a "third angle θ3." The angle defined by the second lateral surface s2 of the second semiconductor layered body 10B and the second region R2 of the second semiconductor layered body 10B is referred to as a "fourth angle θ4." In the first embodiment, the fourth angle θ4 is smaller than the third angle θ3.

With the lateral surfaces of the semiconductor layered bodies defining such angles, as will be described below, a light emitting element having a light distribution characteristic with high intensity of light emitted laterally from the light emitting element can be provided.

Hereinafter, first, a description will be given of the case where the first reflecting layer 31 is not provided. In this case, a sealing member such as resin is disposed on the lateral surfaces of the semiconductor layered bodies. Alternatively, air may be present at the lateral surfaces of the semiconductor layered bodies. For example, light emitted from the first light emitting layer 13A and the second light emitting layer 13B propagates through the first and second semiconductor layered bodies 10A and 10B, the substrate 50 and the like, to reach the first lateral surface s1 and the second lateral surface s2 of each of the first semiconductor layered body 10A and the second semiconductor layered body 10B. For example, reflection (for example, total reflection) occurs due to the difference between a refractive index of each of the first and second semiconductor layered bodies 10A and 10B (for example, GaN), being high, and a refractive index of the outside (for example, resin or air) of a respective one of the semiconductor layered bodies 10A and 10B, being low.

In the first embodiment, the first angle θ1 at the first lateral surface s1 of the first semiconductor layered body 10A is smaller. Thus, for example, light emitted from the light emitting layer and reflected at the first lateral surface s1 of the first semiconductor layered body 10A is easily emitted laterally. On the other hand, the second angle θ2 at the second lateral surface s2 of the first semiconductor layered body 10A is greater. Thus, light emitted from the light emitting layer is reflected at the second lateral surface s2 of the first semiconductor layered body 10A and reflected at the second surface 50b of the substrate 50 and the like, and thus reaches a lateral surface of the substrate 50.

The fourth angle θ4 at the second lateral surface s2 of the second semiconductor layered body 10B is smaller. Thus, for example, light reflected at the second lateral surface s2 of the second semiconductor layered body 10B is easily emitted laterally. On the other hand, the third angle θ3 at the first lateral surface s1 of the second semiconductor layered body 10B is greater. Thus, light emitted from the light emitting layer is reflected at the first lateral surface s1 of the second semiconductor layered body 10B and reflected at the second surface 50b of the substrate 50 and the like, and thus reaches a lateral surface of the substrate 50.

In the embodiment, light propagating toward the second lateral surface s2 of the first semiconductor layered body 10A or the first lateral surface s1 of the second semiconductor layered body 10B tends to be reflected toward another lateral surface of the semiconductor layered bodies. Further, light propagating toward the first lateral surface s1 of the first semiconductor layered body 10A and the second lateral surface s2 of the second semiconductor layered body 10B tends to be emitted laterally. Thus, the light emitting element 110 can have a light distribution characteristic with high intensity of light emitted laterally from the light emitting element 110.

In the first embodiment, the angle defined by the third lateral surface s3 of the first semiconductor layered body 10A and the first region R1 may be smaller than the second angle θ2 defined by the second lateral surface s2 of the first semiconductor layered body 10A and the first region R1. The angle defined by the fourth lateral surface s4 of the first semiconductor layered body 10A and the first region R1 may be smaller than the second angle θ2. The angle defined by the third lateral surface s3 of the second semiconductor layered body 10B and the second region R2 may be smaller than the third angle θ3 defined by the first lateral surface s1 of the second semiconductor layered body 10B and the second region R2. The angle defined by the fourth lateral surface s4 of the second semiconductor layered body 10B and the second region R2 may be smaller than the third angle θ3. For example, a light distribution characteristic exhibiting high intensity of light emitted laterally in the Y-axis direction can be obtained.

In the first embodiment, the first reflecting layer 31 may be provided. As shown in FIG. 1, the first reflecting layer 31 is disposed on the first lateral surface s1 and the second lateral surface s2 of each of the first semiconductor layered body 10A and the second semiconductor layered body 10B. The first reflecting layer 31 reflects light emitted from the first semiconductor layered body 10A and the second semiconductor layered body 10B.

Also in the case in which the first reflecting layer 31 is provided, with the first lateral surface s1 of the first semiconductor layered body 10A having the smaller first angle θ1, light reflected at the first lateral surface s1 of the first semiconductor layered body 10A is easily emitted laterally. With the second lateral surface s2 of the second semiconductor layered body 10B having the smaller fourth angle θ4, light reflected at the second lateral surface s2 of the second semiconductor layered body 10B is easily emitted in the lateral direction. Thus, a light distribution characteristic with high intensity of light emitted laterally from the light emitting device can be obtained.

In the first embodiment, each of the first angle θ1 and the fourth angle θ4 is in a range of, for example, 30 degrees to 45 degrees. Each of the second angle θ2 and the third angle θ3 can be in a range of 60 degrees to 70 degrees. With such a difference in angle, a light distribution characteristic with high intensity of light emitted laterally from the light emitting element can be obtained. The angles θ1 to θ4 can be controlled by controlling the condition of removing (etching) a portion of each of the first and second semiconductor layered bodies 10A and 10B.

The first reflecting layer 31 may include, for example, a metal film. Alternatively, the first reflecting layer 31 may include a dielectric multilayer film in which a plurality of dielectric layers is layered.

An example of the first reflecting layer 31 will be described below.

Each of FIGS. 3A to 3D is a schematic cross-sectional view showing an example of a part of the light emitting element according to the first embodiment.

These drawings show an example of the first reflecting layer 31.

Figure 3A:
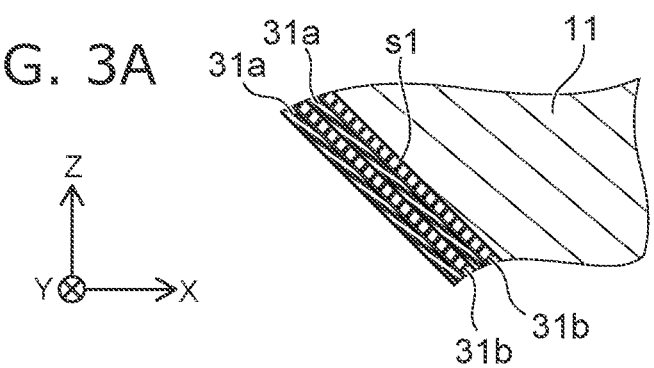
FIG. 3A is a schematic cross-sectional view exemplarily showing a part of the light emitting element according to the first embodiment.

As shown in FIG. 3A, the first reflecting layer 31 includes a first film 31a and a second film 31b. A refractive index of the first film 31a and a refractive index of the second film 31b are different from each other. For example, the first film 31a has a first refractive index. The second film 31b has a second refractive index. The second refractive index is different from the first refractive index. As shown in FIG. 3A, the second film 31b is disposed between the first lateral surface s1 and the first film 31a. In this example, a plurality of first films 31a and a plurality of second films 31b are alternately arranged. A thickness of the first film 31a and a thickness of the second film 31b can be adjusted as appropriate, to reflect light emitted from the light emitting layer.

Figure 3B:
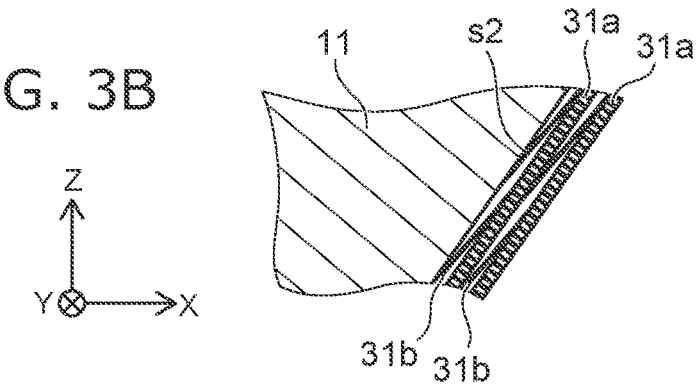
FIG. 3B is a schematic cross-sectional view exemplarily showing another part of the light emitting element according to the first embodiment.
Figure 3C:
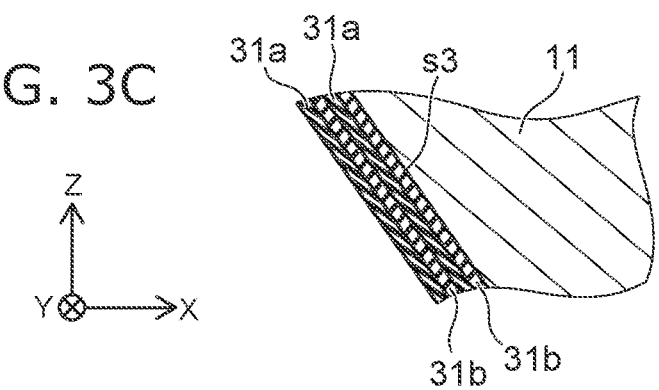
FIG. 3C is a schematic cross-sectional view exemplarily showing even another part of the light emitting element according to the first embodiment.
Figure 3D:
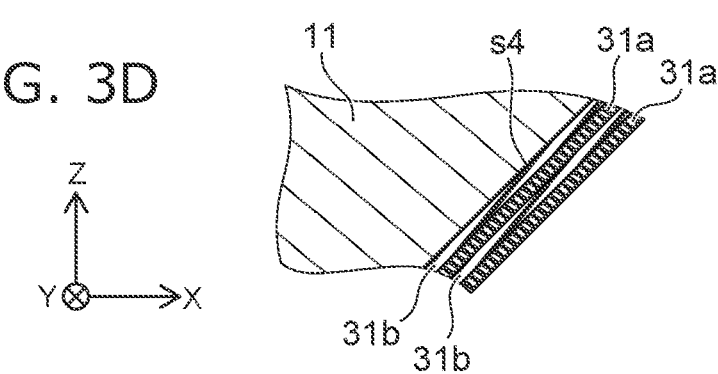
FIG. 3D is a schematic cross-sectional view exemplarily showing still another part of the light emitting element according to the first embodiment.

As shown in FIG. 3B, the second film 31b is disposed between the second lateral surface s2 and the first film 31a. As shown in FIG. 3C, the second film 31b is disposed between the third lateral surface s3 and the first film 31a. As shown in FIG. 3D, the second film 31b is disposed between the fourth lateral surface s4 and the first film 31a.

For example, one of the first film 31a and the second film 31b contains titanium oxide. For example, the other of the first film 31a and the second film 31b contains silicon oxide. The first film 31a and/or the second film 31b may contain niobium oxide.

Such a configuration allows the first reflecting layer 31 to have a high reflectance. Such a configuration allows the first reflecting layer 31 to have high insulating property. Further, leakage at the semiconductor layered bodies can be prevented.

As shown in FIGS. 1 and 2, the first surface 50a of the substrate 50 includes an intermediate region Rs0. The intermediate region Rs0 is positioned between the first region R1 and the second region R2. In this example, the first reflecting layer 31 is in contact with the intermediate region Rs0. In this example, two semiconductor layered bodies are spaced apart from each other. For example, the n-type semiconductor layer 11A of the first semiconductor layered body 10A is spaced apart from the n-type semiconductor layer 11B of the second semiconductor layered body 10B. With this arrangement, light that propagates across the first semiconductor layered body 10A and the second semiconductor layered body 10B via the semiconductor layers can be reduced. Further, an area of the second lateral surface s2 of the first semiconductor layered body 10A and an area of the first lateral surface s1 of the second semiconductor layered body 10B are increased, so that a reflecting area formed by the first reflecting layer 31 disposed on those lateral surfaces s2 and s1 is increased. In this manner, in the case in which two semiconductor layered bodies are spaced apart from each other, provision of the first reflecting layer 31 in the region between the first and second semiconductor layered bodies 10A and 10B (the intermediate region Rs0) allows for achieving efficient reflection of light at the intermediate region Rs0.

As shown in FIGS. 1 and 2, in this example, the first surface 50a of the substrate 50 further includes a first outer peripheral region Rs1 and a second outer peripheral region Rs2. The first region R1 and the second region R2 are located between the first outer peripheral region Rs1 and the second outer peripheral region Rs2. The second region R2 is located between the first region R1 and the second outer peripheral region Rs2. In this example, the first reflecting layer 31 is in contact with the first outer peripheral region Rs1 and the second outer peripheral region Rs2. With the first reflecting layer 31 at the first outer peripheral region Rs1 and the second outer peripheral region Rs2 allows the substrate 50 to guide light also at these outer peripheral regions. For example, the intensity of light emitted laterally from the light emitting element can be further enhanced.

Thus, the first surface 50a may further include outer peripheral region Rs (more specifically, for example, the first outer peripheral region Rs1 and the second outer peripheral region Rs2) between an outer periphery 50E of the substrate 50 and the first region R1. For example, the first reflecting layer 31 is in contact with the outer peripheral region Rs.

Figure 4:
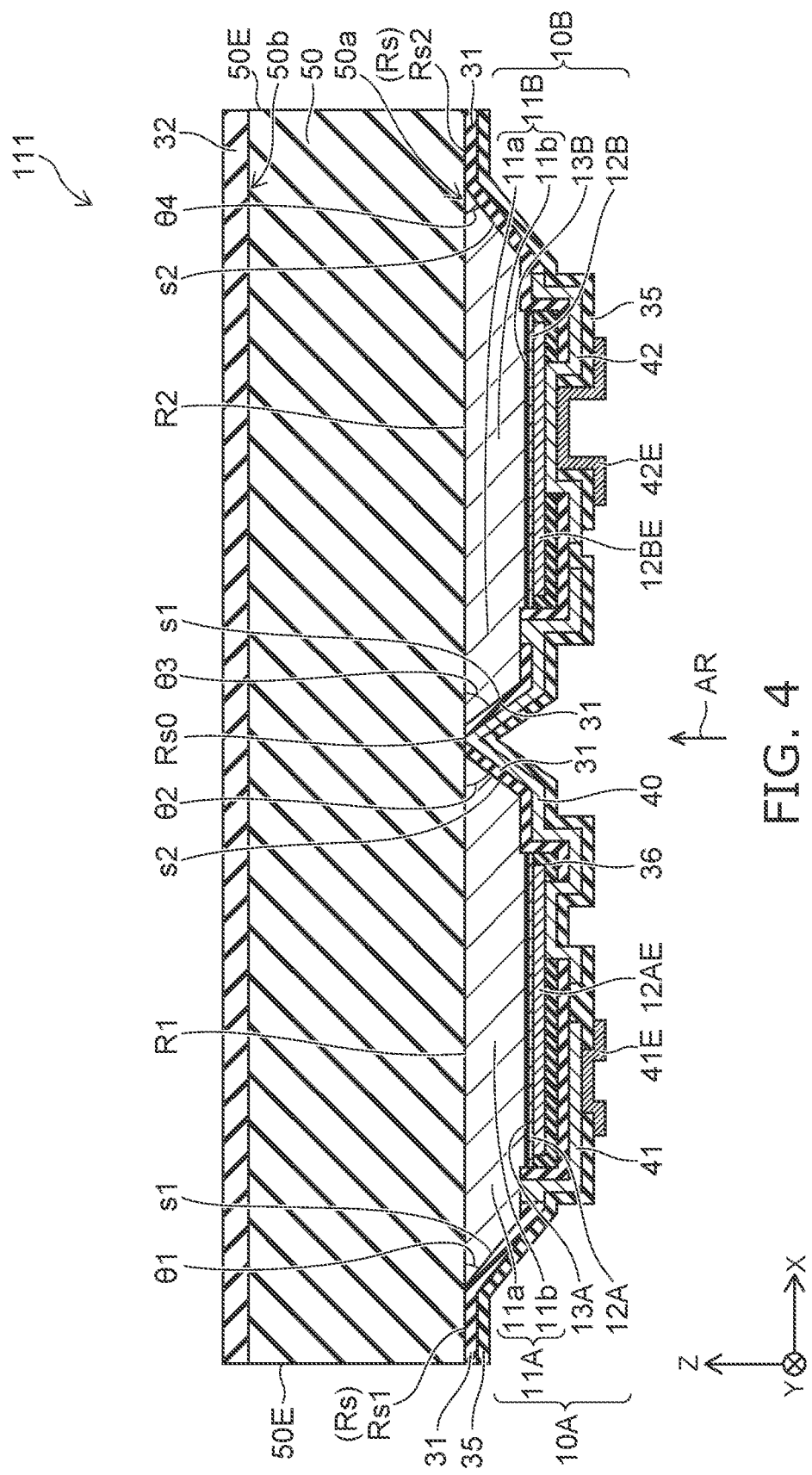
FIG. 4 is a schematic cross-sectional view exemplarily showing another light emitting element according to the first embodiment.

FIG. 4 is a schematic cross-sectional view exemplarily showing another light emitting element according to the first embodiment.

As shown in FIG. 4, a light emitting element 111 according to the first embodiment further includes a second reflecting layer 32, in addition to the substrate 50, the first semiconductor layered body 10A, and the second semiconductor layered body 10B. In this example, the first reflecting layer 31 is also provided. The light emitting element 111 has a structure similar to the light emitting element 110 except that the second reflecting layer 32 is provided. In the following, an example of the second reflecting layer 32 will be described below.

As has been described above, the substrate 50 includes the second surface 50b opposite to the first surface 50a. The second reflecting layer 32 is provided at the second surface 50b. The second reflecting layer 32 reflects light emitted from the first semiconductor layered body 10A and light emitted from the second semiconductor layered body 10B.

For example, a portion of the substrate 50 (for example, the first region R1) is located between the second reflecting layer 32 and the first semiconductor layered body 10A. Another portion of the substrate 50 (for example, the second region R2) is located between the second reflecting layer 32 and the second semiconductor layered body 10B.

With the second reflecting layer 32, light emitted from the second surface 50b can be reduced. Thus, for example, intensity of light emitted laterally from the light emitting device can be further enhanced.

The second reflecting layer 32 may include, for example, a metal film. Alternatively, the second reflecting layer 32 may include a dielectric multilayer film in which a plurality of dielectric layers is layered. An example of the second reflecting layer 32 will be described below.

Figure 5:
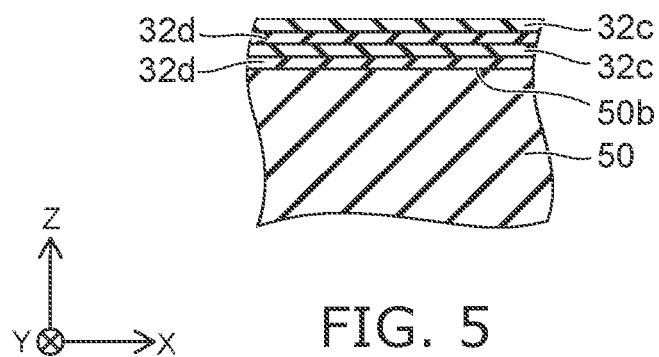
FIG. 5 is a schematic cross-sectional view exemplarily showing a part of the light emitting element according to the first embodiment.

FIG. 5 is a schematic cross-sectional view exemplarily showing a portion of the light emitting element according to the first embodiment.

As shown in FIG. 5, the second reflecting layer 32 includes a third film 32c and a fourth film 32d. The third film 32c has a third refractive index. The fourth film 32d has a fourth refractive index. The fourth refractive index is different from the third refractive index. The fourth film 32d is disposed between the substrate 50 and the third film 32c.

In this example, a plurality of third films 32c and a plurality of fourth films 32d are alternately arranged.

For example, one of the third film 32c and the fourth film 32d contains titanium oxide. For example, the other of the third film 32c and the fourth film 32d contains silicon oxide. The third film 32c and/or the fourth film 32d may contain niobium oxide.

Second Embodiment

Figure 6:
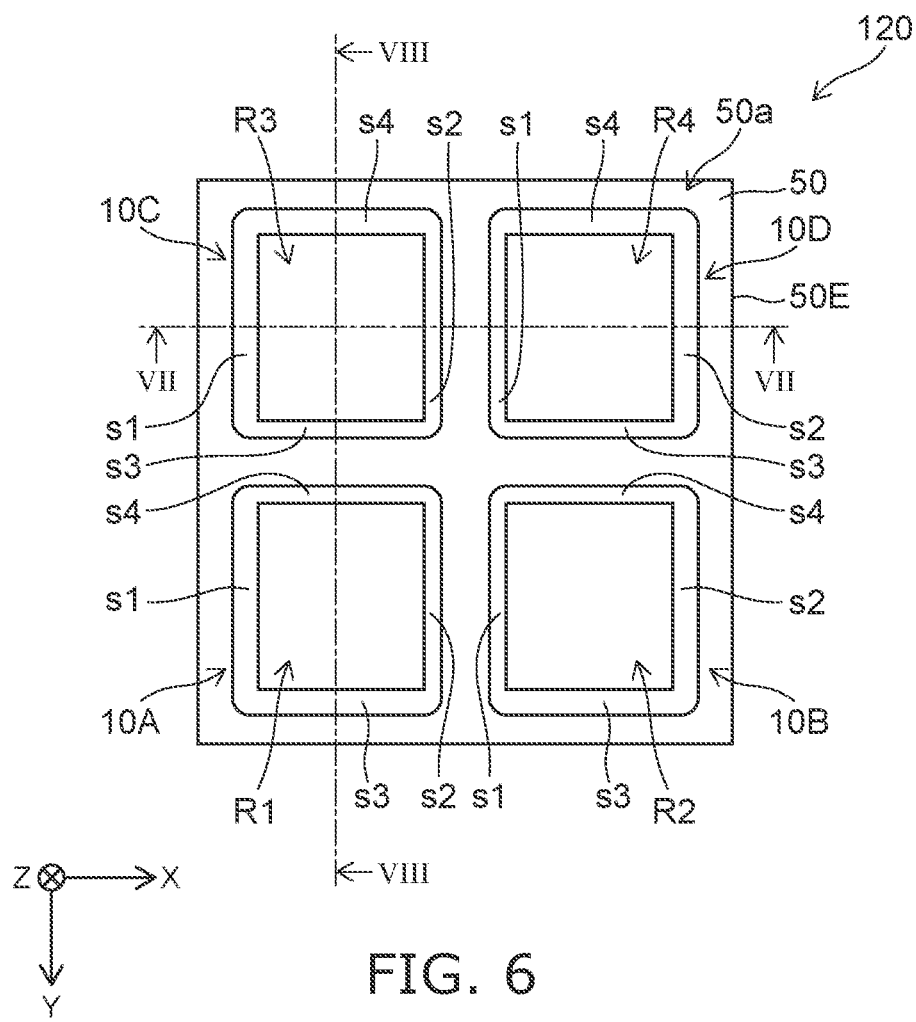
FIG. 6 is a schematic plan view exemplarily showing a light emitting element according to a second embodiment.

FIG. 6 is a schematic plan view exemplarily showing a light emitting element according to a second embodiment.

Figure 7:
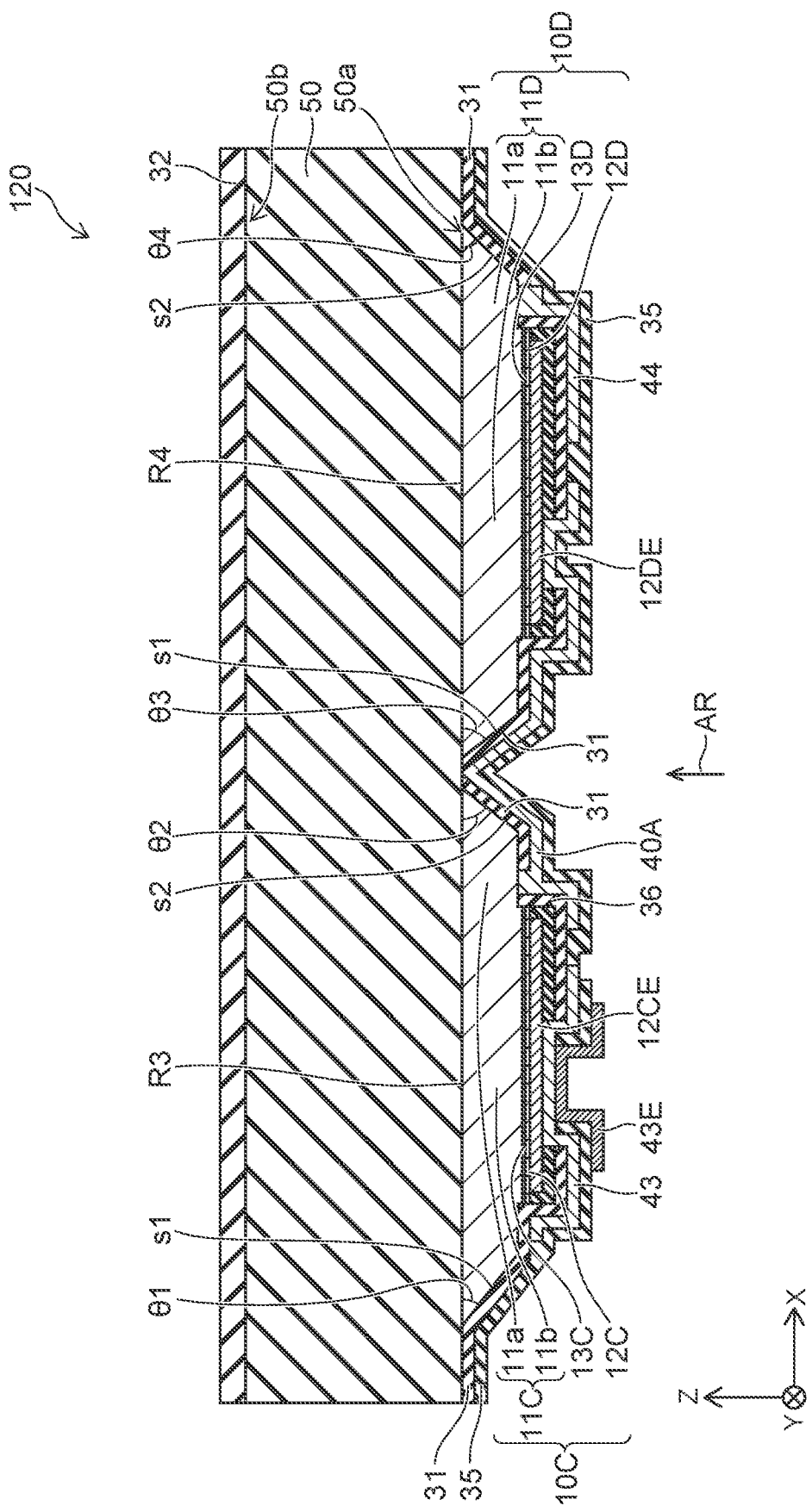
FIG. 7 is a schematic cross-sectional view exemplarily showing the light emitting element according to the second embodiment.
Figure 8:
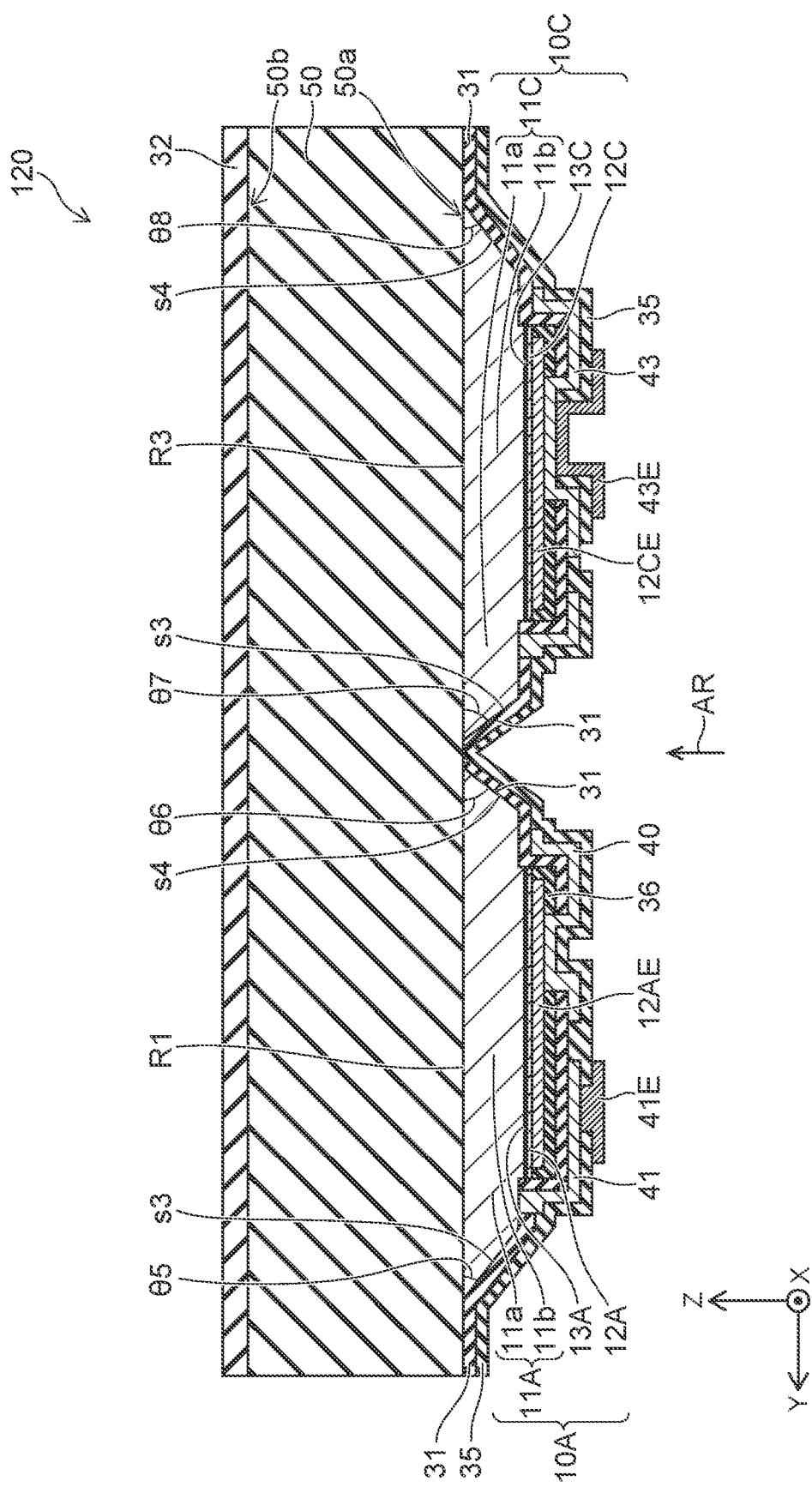
FIG. 8 is a schematic cross-sectional view exemplarily showing the light emitting element according to the second embodiment.

Each of FIGS. 7 and 8 is a schematic cross-sectional view exemplarily showing the light emitting element according to the second embodiment.

FIG. 7 is a cross-sectional view taken along line VII-VII in FIG. 6. FIG. 8 is a cross-sectional view taken along line VIII-VIII in FIG. 6. FIG. 6 is a plan view as seen from arrow AR in FIGS. 7 and 8. In FIG. 6, illustration of some elements may be omitted for the sake of clarity.

As shown in FIG. 6, a light emitting element 120 according to the second embodiment includes, in addition to the substrate 50, the first semiconductor layered body 10A, and the second semiconductor layered body 10B, a third semiconductor layered body 10C and a fourth semiconductor layered body 10D. In the light emitting element 120, the first semiconductor layered body 10A and the second semiconductor layered body 10B have structures similarly to those of the light emitting element 111 and, therefore, detailed description thereof is omitted.

The first surface 50a of the substrate 50 includes, in addition to the first region R1 and the second region R2, a third region R3 and a fourth region R4.

The third semiconductor layered body 10C is disposed on the third region R3. The fourth semiconductor layered body 10D is disposed on the fourth region R4.

The direction from the third semiconductor layered body 10C to the fourth semiconductor layered body 10D coincides with a first direction from the first semiconductor layered body 10A to the second semiconductor layered body 10B (for example, the X-axis direction). A second direction from the first semiconductor layered body 10A to the third semiconductor layered body 10C crosses the first direction from the first semiconductor layered body 10A to the second semiconductor layered body 10B (for example, the X-axis direction). The second direction refers to, for example, the Y-axis direction. The direction from the second semiconductor layered body 10B to the fourth semiconductor layered body 10D coincides with the second direction (the Y-axis direction).

As shown in FIG. 7, the third semiconductor layered body 10C includes, for example, a third light emitting layer 13C, an n-type semiconductor layer 11C, and a p-type semiconductor layer 12C. The n-type semiconductor layer 11C includes the first partial region 11a and the second partial region 11b. For example, in the third semiconductor layered body 10C, the third light emitting layer 13C is disposed between the p-type semiconductor layer 12C and the third region R3. The second partial region 11b is located Between the third light emitting layer 13C and the third region R3. The first partial region 11a does not overlap the p-type semiconductor layer 12C and does not overlap the third light emitting layer 13C in the Z-axis direction.

The fourth semiconductor layered body 10D includes, for example, a fourth light emitting layer 13D, an n-type semiconductor layer 11D, and a p-type semiconductor layer 12D. Also the n-type semiconductor layer 11D includes the first partial region 11a and the second partial region 11b. For example, in the second semiconductor layered body 10D, the fourth light emitting layer 13D is disposed between the p-type semiconductor layer 12D and the fourth region R4. The second partial region 11b is disposed between the fourth light emitting layer 13D and the fourth region R4. The first partial region 11a does not overlap the p-type semiconductor layer 12D and the fourth light emitting layer 13D in the Z-axis direction.

For the third semiconductor layered body 10C and the fourth semiconductor layered body 10D, the structure of the first semiconductor layered body 10A and that of the second semiconductor layered body 10B can be respectively applied.

In this example, a third conductive film 12CE is disposed on the p-type semiconductor layer 12C, and a fourth conductive film 12DE is disposed on the p-type semiconductor layer 12D.

As shown in FIG. 7, a third conductive member 43 is electrically connected to the p-type semiconductor layer 12C of the third semiconductor layered body 10C. The third conductive member 43 is electrically connected to a third electrode 43E. In this example, a first end portion of other connecting member 40A is electrically connected to the first partial region 11a of the third semiconductor layered body 10C. A second end portion of the connecting member 40A is electrically connected to the p-type semiconductor layer 12D of the fourth semiconductor layered body 10D.

A fourth conductive member 44 is electrically connected to the first partial region 11a of the fourth semiconductor layered body 10D. The fourth conductive member 44 may be, for example, electrically connected to the p-type semiconductor layer 12B of the second semiconductor layered body 10B (see FIG. 1).

As shown in FIG. 6, each of the first to fourth semiconductor layered bodies 10A to 10D includes the first to fourth lateral surfaces s1 to s4.

As shown in FIG. 8, the first semiconductor layered body 10A includes the third lateral surface s3 and the fourth lateral surface s4. The fourth lateral surface s4 of the first semiconductor layered body 10A is opposite to the third lateral surface s3 of the first semiconductor layered body 10A.

The third semiconductor layered body 10C includes the third lateral surface s3 and the fourth lateral surface s4. The third lateral surface s3 of the third semiconductor layered body 10C faces the fourth lateral surface s4 of the first semiconductor layered body 10A, and is located closer to the first semiconductor layered body 10A. The fourth lateral surface s4 of the third semiconductor layered body 10C is opposite to the third lateral surface s3 of the third semiconductor layered body 10C, and is located farther from the first semiconductor layered body 10A.

For example, the distance between the third lateral surface s3 of the third semiconductor layered body 10C and the first semiconductor layered body OA (more specifically, for example, the fourth lateral surface s4 of the first semiconductor layered body 10A) is shorter than the distance between the fourth lateral surface s4 of the third semiconductor layered body 10C and the first semiconductor layered body 10A (more specifically, for example, the fourth lateral surface s4 of the first semiconductor layered body 10A).

For example, the fourth lateral surface s4 of the first semiconductor layered body 10A is positioned between the third lateral surface s3 of the first semiconductor layered body 10A and the fourth lateral surface s4 of the third semiconductor layered body 10C. The third lateral surface s3 of the third semiconductor layered body 10C is positioned between the fourth lateral surface s4 of the first semiconductor layered body 10A and the fourth lateral surface s4 of the third semiconductor layered body 10C.

The angle defined by the third lateral surface s3 of the first semiconductor layered body 10A and the first region R1 is referred to as a fifth angle $\theta 5$. The angle defined by the fourth lateral surface s4 of the first semiconductor layered body 10A and the first region R1 is referred to as a sixth angle $\theta 6$. In the second embodiment, the fifth angle $\theta 5$ is smaller than the sixth angle $\theta 6$.

The angle defined by the third lateral surface s3 of the third semiconductor layered body 10C and the third region R3 is referred to as a seventh angle $\theta 7$. The angle defined by the fourth lateral surface s4 of the third semiconductor layered body 10C and the third region R3 is referred to as an eighth angle $\theta 8$. In the second embodiment, the eighth angle $\theta 8$ is smaller than the seventh angle $\theta 7$.

With such angles (that is, the fifth to eighth angles $\theta 5$ to $\theta 8$), similarly to the first to fourth angles $\theta 1$ to $\theta 4$, a light emitting element having a light distribution characteristic with high intensity of light emitted laterally from the light emitting element can be obtained.

An exemplary application of the light emitting element according to one embodiment will be described below.

Figure 9:
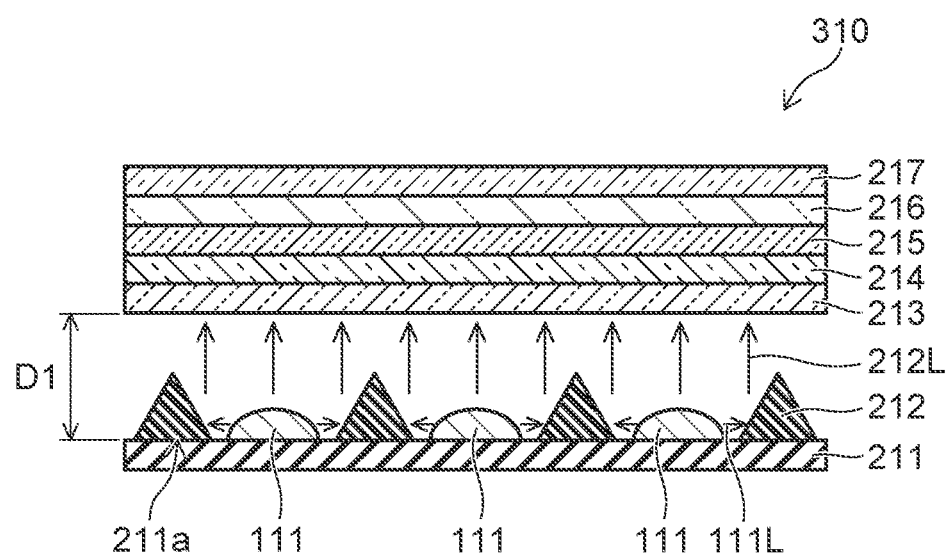
FIG. 9 is a schematic cross-sectional view exemplarily showing an illumination device to which the light emitting element according to one embodiment is applied.

FIG. 9 is a schematic cross-sectional view exemplarily showing an illumination device to which the light emitting element according to one embodiment is applied. As shown in FIG. 9, a plurality of light emitting elements (in this example, the light emitting elements 111) is disposed on the upper surface of a mounting substrate 211 in an illumination device 310. Reflecting bodies 212 are provided such that each of the reflecting bodies 212 is disposed between respective ones of the plurality of light emitting elements 111. Each of the reflecting bodies 212 has an inclined surface being inclined with respect to a main surface 211a of the mounting substrate 211.

For example, a diffusing plate 213, a fluorescent material sheet 214, a first prism 215, a second prism 216, and a polarizing film 217 are provided in sequence above the reflecting bodies 212.

For example, blue light 111L is emitted from each of the light emitting elements 111. The light 111L is emitted along the main surface 211a of the mounting substrate 211. The light 111L is reflected at a respective one of the reflecting bodies 212 to be a reflected light 212L. The reflected light 212L propagates toward diffusing plate 213.

In the embodiment, the light 111L emitted from each light emitting element 111 advances substantially along the main surface 211a. For example, the light 111L does not directly propagate toward the diffusing plate 213 from each light emitting element 111. This configuration allows for reducing a distance D1 between the main surface 211a and the diffusing plate 213. Also with the short distance D1, the illumination device 310 with uniform luminance can be obtained. The illumination device 310 may be used for, for example, a backlight for a liquid crystal display device.

Certain embodiments of the present invention allows for providing alight emitting element having a light distribution characteristic with high intensity of light emitted laterally from the light emitting device.

Certain embodiments of the present invention have been described above with reference to specific examples. However, the present invention is not limited to the specific examples described above. For example, specific structures of the substrate, the semiconductor layered bodies, the light emitting layers, the semiconductor layers, and the reflecting layers included in the light emitting element can be selected from known configurations by a person skilled in the art, and are within the scope of the present invention so long as the specific structures can be similarly implemented and the similar effect can be obtained.

Further, the scope of the present invention also covers technically possible combinations of at least two elements in the specific examples so long as the combination is within the spirit of the present invention.

Still further, every light emitting element that can be obtained by a person skilled in the art with appropriate change in the design on the basis of the light emitting element described above as certain embodiments of the present disclosure is within the scope of the present disclosure so long as they are within the spirit of the present invention.

Even further, within the scope of the idea of the present disclosure, a person skilled in the art would arrive at various variations and modifications, which variations and modifications are also construed to belong within the scope of the present invention.

DENOTATION OF REFERENCE NUMERALS 10A to 10D first to fourth semiconductor layered bodies
11A to 11D n-type semiconductor layer
11a first partial region
11b second partial region
12A to 12D p-type semiconductor layer
12AE, 12BE, 12CE, 12DE first to fourth conductive films
13A to 13D first to fourth light emitting layers
31 first reflecting layer
31a first film
31b second film
32 second reflecting layer
32c third film
32d fourth film
35,36 insulating layer
40, 40A connecting member
41 to 44 first to fourth conductive members
41E, 42E, 43E first, second, third electrodes
50 substrate
50E outer edge
50a first surface
50b second surface
$\theta 1$ to $\theta 8$ first to eighth angles
110, 111, 120 light emitting element
111L light
211 mounting substrate
211a main surface
212 reflecting body
212L light
213 diffusing plate 214 fluorescent material sheet
215 first prism
216 second prism
217 polarizing film
310 illumination device
AR arrow
D1 distance
R1 to R4 first to fourth regions
Rs outer peripheral region
Rs0 intermediate region
Rs1 first outer peripheral region
Rs2 second outer peripheral region
s1 to s4 first to fourth lateral surfaces

What is claimed is:

1. A light emitting element comprising:
a substrate including a first surface including a first region and a second region;
a first semiconductor layered body on the first region of the first surface of the substrate, the first semiconductor layered body comprising a first light emitting layer and including:
a first lateral surface, and
a second lateral surface opposite to the first lateral surface of the first semiconductor layered body; and
a second semiconductor layered body on the second region of the first surface of the substrate, the second semiconductor layered body comprising a second light emitting layer and including:
a first lateral surface facing the second lateral surface of the first semiconductor layered body and located on a first semiconductor layered body side of the second semiconductor layered body, and
a second lateral surface opposite to the first lateral surface of the second semiconductor layered body and located on a side opposite the first semiconductor layered body side of the second semiconductor layered body, wherein:
a first angle defined by the first lateral surface of the first semiconductor layered body and the first region is smaller than a second angle defined by the second lateral surface of the first semiconductor layered body and the first region, and
the first angle is smaller than a third angle defined by the first lateral surface of the second semiconductor layered body and the second region.

2. The light emitting element according to claim 1, further comprising a first reflecting layer disposed on the first and second lateral surfaces of the first semiconductor layered body and on the first and second lateral surfaces of the second semiconductor layered body, to reflect light emitted from the first semiconductor layered body and light emitted from the second semiconductor layered body.

3. The light emitting element according to claim 2, wherein:
the first reflecting layer comprises
a first film having a first refractive index, and
a second film disposed between the first lateral surface and the first film and having a second refractive index different from the first refractive index.

4. The light emitting element according to claim 3, wherein:
the first surface of the substrate further includes an intermediate region between the first region and the second region, and
the first reflecting layer is in contact with the intermediate region.

5. The light emitting element according to claim 4, wherein:
the first surface further includes an outer peripheral region between an outer edge of the substrate and the first region, and
the first reflecting layer is in contact with the outer peripheral region.

6. The light emitting element according to claim 2, wherein:
the first surface of the substrate further includes an intermediate region between the first region and the second region, and
the first reflecting layer is in contact with the intermediate region.

7. The light emitting element according to claim 6, wherein:
the first surface further includes an outer peripheral region between an outer edge of the substrate and the first region, and
the first reflecting layer is in contact with the outer peripheral region.

8. The light emitting element according to claim 2, wherein:
the substrate further includes a second surface opposite to the first surface, and
a second reflecting layer is disposed on the second surface, to reflect light from the first and second semiconductor layered bodies.

9. The light emitting element according to claim 8, wherein:
the first surface of the substrate further including a third region and a fourth region,
the light emitting element further comprises:
a third semiconductor layered body including a third light emitting layer and disposed on the third region of the first surface; and
a fourth semiconductor layered body including a fourth light emitting layer and disposed on the fourth region of the first surface,
the first semiconductor layered body further includes:
a third lateral surface, and
a fourth lateral surface opposite to the third lateral surface of the first semiconductor layered body,
the third semiconductor layered body further includes:
a third lateral surface facing the fourth lateral surface of the first semiconductor layered body and located on a first semiconductor layered body side of the third semiconductor layered body, and
a fourth lateral surface opposite to the third lateral surface of the third semiconductor layered body and located on a side opposite the first semiconductor layered body side of the third semiconductor layered body,
a fifth angle defined by the third lateral surface of the first semiconductor layered body and the first region is smaller than a sixth angle defined by the fourth lateral surface of the first semiconductor layered body and the first region, and
an eighth angle defined by the fourth lateral surface of the third semiconductor layered body and the third region is smaller than a seventh angle defined by the fourth lateral surface of the third semiconductor layered body and the third region.

10. The light emitting element according to claim 2, wherein:
the first surface of the substrate further including a third region and a fourth region, the light emitting element further comprises:
- a third semiconductor layered body including a third light emitting layer and disposed on the third region of the first surface; and
- a fourth semiconductor layered body including a fourth light emitting layer and disposed on the fourth region of the first surface, the first semiconductor layered body further includes:
- a third lateral surface, and
- a fourth lateral surface opposite to the third lateral surface of the first semiconductor layered body, the third semiconductor layered body further includes:
- a third lateral surface facing the fourth lateral surface of the first semiconductor layered body and located on a first semiconductor layered body side of the third semiconductor layered body, and
- a fourth lateral surface opposite to the third lateral surface of the third semiconductor layered body and located on a side opposite the first semiconductor layered body side of the third semiconductor layered body, a fifth angle defined by the third lateral surface of the first semiconductor layered body and the first region is smaller than a sixth angle defined by the fourth lateral surface of the first semiconductor layered body and the first region, and an eighth angle defined by the fourth lateral surface of the third semiconductor layered body and the third region is smaller than a seventh angle defined by the fourth lateral surface of the third semiconductor layered body and the third region.

11. The light emitting element according to claim 2, wherein the first reflecting layer contains one or more of titanium oxide, silicon oxide, and niobium oxide.

12. The light emitting element according to claim 1, wherein:
- the substrate further includes a second surface opposite to the first surface, and
- a second reflecting layer is disposed on the second surface, to reflect light from the first and second semiconductor layered bodies.

13. The light emitting element according to claim 12, wherein:
the second reflecting layer comprises:
- a third film having a third refractive index, and
- a fourth film disposed between the substrate and the third film and having a fourth refractive index being different from the third refractive index.

14. The light emitting element according to claim 12, wherein:
the first surface of the substrate further including a third region and a fourth region,
the light emitting element further comprises:
- a third semiconductor layered body including a third light emitting layer and disposed on the third region of the first surface; and
- a fourth semiconductor layered body including a fourth light emitting layer and disposed on the fourth region of the first surface, the first semiconductor layered body further includes:
- a third lateral surface, and
- a fourth lateral surface opposite to the third lateral surface of the first semiconductor layered body, the third semiconductor layered body further includes:
- a third lateral surface facing the fourth lateral surface of the first semiconductor layered body and located on a first semiconductor layered body side of the third semiconductor layered body, and
- a fourth lateral surface opposite to the third lateral surface of the third semiconductor layered body and located on a side opposite the first semiconductor layered body side of the third semiconductor layered body, a fifth angle defined by the third lateral surface of the first semiconductor layered body and the first region is smaller than a sixth angle defined by the fourth lateral surface of the first semiconductor layered body and the first region, and an eighth angle defined by the fourth lateral surface of the third semiconductor layered body and the third region is smaller than a seventh angle defined by the fourth lateral surface of the third semiconductor layered body and the third region.

15. The light emitting element according to claim 12, wherein the second reflecting layer contains one or more of titanium oxide, silicon oxide, and niobium oxide.

16. The light emitting element according to claim 1, wherein:
- the first angles is in a range of 30 degrees to 45 degrees, and
- each of the second and third angles is in a range of 60 degrees to 70 degrees.

17. The light emitting element according to claim 1, wherein:
the first surface of the substrate further including a third region and a fourth region,
the light emitting element further comprises:
- a third semiconductor layered body including a third light emitting layer and disposed on the third region of the first surface; and
- a fourth semiconductor layered body including a fourth light emitting layer and disposed on the fourth region of the first surface, the first semiconductor layered body further includes:
- a third lateral surface, and
- a fourth lateral surface opposite to the third lateral surface of the first semiconductor layered body, the third semiconductor layered body further includes:
- a third lateral surface facing the fourth lateral surface of the first semiconductor layered body and located on a first semiconductor layered body side of the third semiconductor layered body, and
- a fourth lateral surface opposite to the third lateral surface of the third semiconductor layered body and located on a side opposite the first semiconductor layered body side of the third semiconductor layered body, a fifth angle defined by the third lateral surface of the first semiconductor layered body and the first region is smaller than a sixth angle defined by the fourth lateral surface of the first semiconductor layered body and the first region, and an eighth angle defined by the fourth lateral surface of the third semiconductor layered body and the third region is smaller than a seventh angle defined by the fourth lateral surface of the third semiconductor layered body and the third region.

18. The light emitting element according to claim 1, wherein the first semiconductor layered body and the second semiconductor layered body include a nitride semiconductor.

* * * * *